(12) United States Patent
Towns et al.

(10) Patent No.: US 7,893,172 B2
(45) Date of Patent: Feb. 22, 2011

(54) OLIGOMER AND POLYMER COMPRISING TRIPHENYL PHOSPHINE UNITS

(75) Inventors: Carl Towns, Stansted (GB); Ian Rees, Cambridge (GB); Ilaria Grizzi, Cambridge (GB); Paul Wallace, Royston (GB)

(73) Assignee: Merck Patent GmbH, Darmstadt (DE)

( * ) Notice: Subject to any disclaimer, the term of this patent is extended or adjusted under 35 U.S.C. 154(b) by 852 days.

(21) Appl. No.: 10/568,659

(22) PCT Filed: Aug. 18, 2004

(86) PCT No.: PCT/EP2004/009249

§ 371 (c)(1),
(2), (4) Date: Feb. 15, 2006

(87) PCT Pub. No.: WO2005/017065

PCT Pub. Date: Feb. 24, 2005

(65) Prior Publication Data

US 2007/0031698 A1    Feb. 8, 2007

(30) Foreign Application Priority Data

Aug. 19, 2003    (EP)    ................................... 03018832

(51) Int. Cl.
*C08F 283/00*    (2006.01)
*C08G 73/02*    (2006.01)

(52) U.S. Cl. ........................... 525/540; 523/1; 428/690; 528/398; 528/422; 252/301.34; 252/301.35; 252/510

(58) Field of Classification Search ................. 252/500, 252/301.34, 301.35, 510; 313/504; 428/690; 430/58.2; 528/394, 422, 398; 523/1; 525/540
See application file for complete search history.

(56) References Cited

U.S. PATENT DOCUMENTS

| | | | | |
|---|---|---|---|---|
| 4,832,467 A | * | 5/1989 | Miyagi et al. | ............... 359/273 |
| 5,256,945 A | * | 10/1993 | Imai et al. | .................... 313/504 |
| 5,413,886 A | * | 5/1995 | Pai et al. | ..................... 430/58.3 |
| 5,728,801 A | * | 3/1998 | Wu et al. | ..................... 528/422 |
| 6,309,763 B1 | * | 10/2001 | Woo et al. | .................... 428/690 |
| 6,493,208 B1 | | 12/2002 | Piché et al. | |
| 6,605,373 B2 | * | 8/2003 | Woo et al. | .................... 428/690 |
| 6,630,566 B1 | * | 10/2003 | Allen et al. | ................. 528/422 |
| 7,351,788 B2 | * | 4/2008 | O'Dell et al. | ............... 528/394 |
| 2003/0165713 A1 | * | 9/2003 | Oguma et al. | ............... 428/690 |
| 2004/0185299 A1 | * | 9/2004 | Ly | .............................. 428/690 |

FOREIGN PATENT DOCUMENTS

| | | |
|---|---|---|
| JP | 2001-527102 T | 12/2001 |
| WO | WO 99/32537 | 7/1999 |
| WO | WO-99/32537 A1 | 7/1999 |
| WO | WO 03/007395 | 1/2003 |
| WO | WO-03/035713 A1 | 5/2003 |
| WO | WO 03/041186 | 5/2003 |
| WO | WO 03/048225 A2 | 6/2003 |
| WO | WO 2005/003656 A1 | 1/2005 |
| WO | WO 2005/005927 A1 | 1/2005 |

OTHER PUBLICATIONS

Dong et al., "Triarylphosphine oxide based benzazole polymers for potential space applications," 2000, 41(2), pp. 1213-1214.*
Japanese Official Action dated Jun. 22, 2010.

* cited by examiner

*Primary Examiner*—Mark Kopec
*Assistant Examiner*—Khanh Tuan Nguyen
(74) *Attorney, Agent, or Firm*—Connolly Bove Lodge & Hutz LLP

(57) ABSTRACT

An oligomer or polymer comprising a first repeat unit and a second repeat unit that may be the same or different, the first repeat unit having formula (I): wherein each E independently represents optionally substituted nitrogen or optionally substituted phosphorus, with the proviso that at least one E is optionally substituted phosphorus; each $Ar^1$, $Ar^2$ and $Ar^3$ is the same or different and independently represents an optionally substituted aryl or heteroaryl; n is 0-3; and in the case of unsubstituted nitrogen and phosphorus, the second repeat unit is directly conjugated to the first repeat unit.

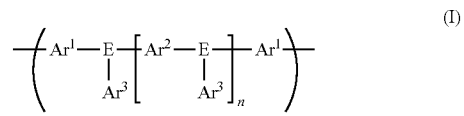

(I)

13 Claims, No Drawings

OLIGOMER AND POLYMER COMPRISING TRIPHENYL PHOSPHINE UNITS

RELATED APPLICATIONS

This application is the U.S. National Stage of International Application No. PCT/EP2004/009249, filed Aug. 18, 2004, published in English, and claims priority under 35 U.S.C. §365 to European Application No. 03018832.0, filed Aug. 19, 2003.

FIELD OF THE INVENTION

This invention relates to semiconductive oligomers and polymers, their synthesis and use in optical devices.

BACKGROUND OF THE INVENTION

One class of opto-electrical devices is that using an organic material for light emission (an organic light emitting device or "OLED") or as the active component of a photocell or photodetector (a "photovoltaic" device). The basic structure of these devices is a semiconducting organic layer sandwiched between a cathode for injecting or accepting negative charge carriers (electrons) and an anode for injecting or accepting positive charge carriers (holes) into the organic layer.

In an organic electroluminescent device, electrons and holes are injected into a layer of electroluminescent semiconducting material where they combine to generate excitons that undergo radiative decay. Holes are injected from the anode into the a highest occupied molecular orbital (HOMO) of the electroluminescent material; electrons are injected from the cathode into the lowest unoccupied molecular orbital (LUMO) of the electroluminescent material. An organic hole injecting material is commonly provided to assist injection of charge from the anode into the electroluminescent layer. In WO 90/13148 the organic light-emissive material is a conjugated polymer, namely poly (p-phenylenevinylene) ("PPV"). Other light emitting polymers known in the art include polyfluorenes and polyphenylenes. In U.S. Pat. No. 4,539,507 the organic light-emissive material is of the class known as small molecule materials, such as (8-hydroxyquinoline) aluminium ("Alq$_3$"). Light emitting polymers such as polyfluorenes and polyphenylenes are advantageous in that they are solution processable. In particular, solution processable light emitting polymers may be inkjet printed as described in EP 0880303 to produce high information content displays, in particular full colour displays.

An essential requirement for an effective OLED is efficient injection of holes and electrons into the electroluminescent layer of the OLED. Therefore, a focus in the OLED field is the development of hole and/or electron transporting materials to be used in combination with the electroluminescent material. An effective hole transporting material has a HOMO level that lies between the workfunction of the anode (or organic hole injecting material) and the HOMO level of the electroluminescent material.

Another focus in the OLED field is the development of full colour OLEDs, i.e. OLEDs comprising red, green and blue electroluminescent materials. A drawback of many blue organic electroluminescent materials is that their emission is a relatively pale blue, due to an insufficiently large HOMO-LUMO bandgap, when compared to the standard blue as defined by 1931 CIE co-ordinates.

WO 99/48160 discloses hole transporting co-polymers "TFB" and "PFB":

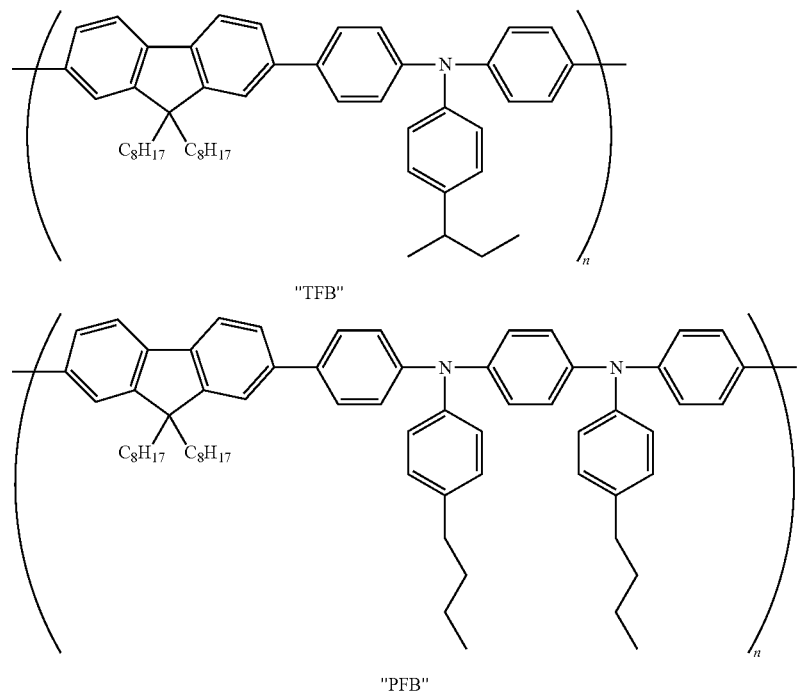

"TFB"

"PFB"

These materials may be used as hole transporting materials and/or as blue electroluminescent materials. However, the above identified co-polymers have drawbacks. In particular, the HOMO levels of these materials are not ideally matched to the workfunction of the typical anode and/or organic hole injecting material, which negatively affects their hole transporting properties. Furthermore, the blue emission from these materials is a relatively pale blue.

There therefore exists a need for polymers having good hole transporting properties and a deeper blue colour. Phosphine-containing polymers are known. For example, EP 0339424 discloses polythioarylenes with phosphine repeat units. Repeat units within this polymer are not conjugated together, but are separated by a sulfur atom. These polymers are described for use in fields taking advantage of their inert, thermoplastic properties and as such the teaching of this document is not relevant to the field of the present invention of organic semiconductors.

J. Organomet. Chem. 653, 167-176, 2002 discloses a homopolymer comprising a diphenylalkylphosphine repeat unit.

WO 99/32537 discloses polymers comprising repeat units each of which consists essentially of units $Ar_3Y$ where Y can be N, P, etc. Copolymers of units $Ar_3Y$ with other repeat units are not mentioned. In the preferred embodiment of this application, Y represents nitrogen; there are no embodiments wherein Y is phosphorus or any indication of advantages of phosphines over the exemplified amines. Furthermore, there is no disclosure of how copolymers comprising such repeat units may be synthesised.

SUMMARY OF THE INVENTION

The present inventors have surprisingly found that using triarylphosphines in place of prior art triarylamines results in significant improvement in hole transporting properties of the material and deeper blue emission.

Accordingly, in a first aspect the invention provides an oligomer or polymer comprising a first repeat unit and a second repeat unit that may be the same or different, the first repeat unit having formula (I):

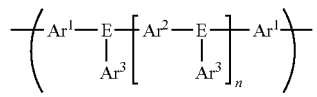

wherein each E independently represents optionally substituted nitrogen or optionally substituted phosphorus, with the proviso that at least one E is optionally substituted phosphorus; each $Ar^1$, $Ar^2$ and $Ar^3$ is the same or different and independently represents an optionally substituted $C_3$ to $C_{30}$ aryl or heteroaryl; n is 0-3; and in the case of unsubstituted nitrogen and phosphorus, the second repeat unit is directly conjugated to the first repeat unit.

The triarylphosphines according to the invention are more stable than the diphenylalkyl phosphine described in the prior art because the lone pair of the phosphorus has an extra π-system to donate into. In contrast, the alkyl group of the prior art diphenylalkylphosphines donates electron density to the phosphorus atom.

In one preferred embodiment, each of $Ar^1$, $Ar^2$ and $Ar^3$ is an optionally substituted phenyl.

In another preferred embodiment, $Ar^2$ is optionally substituted biphenyl. More preferably, $Ar^1$ and $Ar^3$ according to this embodiment are optionally substituted phenyl.

In a yet further preferred embodiment, $Ar^3$ is optionally substituted heteroaryl.

In one preferred embodiment, each E is phosphorus. In another preferred embodiment, n is 0 and E is phosphorus. In still another preferred embodiment, n is 1-3 and at least one E is nitrogen.

The electronic or physical properties of the oligomers or polymers according to the invention (such as, respectively, electron affinity or solubility) may be modified by suitable substituents. Therefore, it is preferred that, at least one $Ar^3$ is substituted by a substituent selected from the group consisting of optionally substituted, branched, cyclic or linear $C_{1-20}$ alkyl or $C_{1-20}$ alkoxy; $C_{1-20}$ fluoroalkyl, fluorine, optionally substituted diarylamine and optionally substituted diarylphosphine.

Where the group E is phosphorus, it may be trivalent or pentavalent phosphorus. Preferably, E is selected from the group consisting of unsubstituted nitrogen, unsubstituted phosphorus or phosphorus oxide.

Preferably, the second repeat unit is different from the first repeat unit. More preferably, the second repeat unit is selected from optionally substituted phenyl, fluorene, spirobifluorene, indenofluorene, heteroaryl, dihydrophenanthrene or triarylamine.

In a second aspect the invention provides a method of forming an oligomer or polymer according to any preceding claim comprising the step of oligomerising or polymerising a monomer of formula (II) in the presence of a metal catalyst of variable oxidation state:

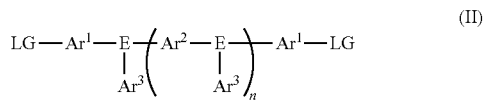

wherein $Ar^1$, $Ar^2$ and $Ar^3$, E and n are as described with respect to the first aspect of the invention, and each LG is the same or different and represents a leaving group capable of participating in a polycondensation mediated by a metal of variable oxidation state.

Preferably, the polycondensation comprises a metal insertion step with a nickel or palladium complex catalyst.

Preferably, each LG is the same or different and is independently selected from halogen; a reactive boronic group selected from a boronic acid group, a boronic ester group and a borane group; or a moiety of formula —O—$SO_2$—Z wherein Z is selected from the group consisting of optionally substituted alkyl and aryl.

Alternative groups LG include a group of formula —(DZ)$_m$—B-$Hal_3^-$$M^+$ wherein DZ represents a diazonium group, each Hal independently represents a halogen and $M^+$ represents a metal cation; and a group of formula O—$SiR^7_3$ wherein each $R^7$ independently represents an optionally substituted alkyl or aryl.

Preferably, Hal is fluorine. Preferably, $M^+$ is an alkali metal more preferably sodium or potassium. Preferably, $R^7$ is alkyl more preferably methyl.

In a first preferred embodiment of the second aspect, each LG is independently a halogen or a moiety of formula —O—$SO_2$—Z, and the monomer of formula (II) is oligomerised or polymerised in the presence of a nickel complex catalyst.

In a second preferred embodiment of the second aspect, the monomer of formula (II) is oligomerised or polymerised with a second aromatic monomer in the presence of a palladium complex catalyst and a base and a. each LG is the same or different and comprises a reactive boronic group and the second monomer comprises two reactive groups independently selected from halogen and a moiety of formula —O—SO$_2$—Z, or
b. each LG independently comprises a halogen or a moiety of formula —O—SO$_2$—Z and the second monomer comprises two reactive boron groups which are the same or different.

In a third preferred embodiment of the second aspect, one LG is a reactive boron group; the other LG is a halogen or a moiety of formula —O—SO$_2$—Z; and the monomer of formula (II) is oligomerised or polymerised in the presence of a palladium complex catalyst and a base.

In a third aspect, the invention provides a monomer comprising a repeat unit of formula (III):

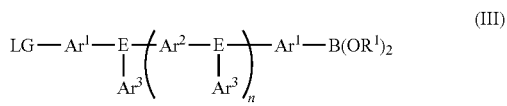

(III)

wherein $Ar^1$, $Ar^2$ and $Ar^3$, E, LG and n are as defined in any one of claims 1-5; each $R^1$ independently represents hydrogen or optionally substituted, branched, cyclic or linear $C_{1-20}$ alkyl, aryl or heteroaryl; and both groups $OR^1$ associated with the same boron atom may be joined to form a ring.

Preferably, LG has a formula —B($OR^1$)$_2$

Preferably, at least one $R^1$ represents a linear, branched or cyclic $C_{1-20}$ alkyl.

Preferably, the at least one group —B($OR^1$)$_2$ represents an optionally substituted residue of formula (IV):

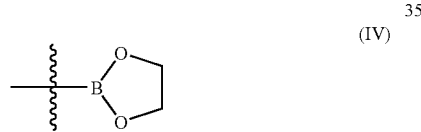

(IV)

Preferably, at least one carbon atom of the residue of formula (IV) is substituted. More preferably, both carbon atoms are substituted. Preferred substituents are linear, branched or cyclic $C_{1-20}$ alkyl. Most preferably, each carbon carries two methyl groups (pinacol ester).

In a fourth aspect, the invention provides an optical device comprising an oligomer or polymer according to the first aspect of the invention.

Preferably, the oligomer or polymer is located in a layer between a first electrode for injection of holes and a second electrode for injection of electrons.

Preferably, the optical device is an electroluminescent device, i.e. a device that produces electroluminescence from the oligomer or polymer when a forward bias is applied across the electrodes. Alternatively, the device may be a photovoltaic device.

In a fifth aspect, the invention provides a switching device comprising an oligomer or polymer according to the first aspect of the invention.

Preferably, the switching device is a field effect transistor comprising an insulator having a first side and a second side; a gate electrode located on the first side of the insulator; an oligomer or polymer according to the first aspect of the invention located on the second side of the insulator; and a drain electrode and a source electrode located on the oligomer or polymer.

In a sixth aspect, the invention provides an integrated circuit comprising a field effect transistor according to the fifth aspect of the invention.

DETAILED DESCRIPTION OF THE INVENTION

The invention is described hereinafter with reference to polymers and polymerisation, however it will be appreciated that this description applies equally to corresponding oligomers and oligomerisation.

Polymers according to the invention may be used as active materials in any of the aforementioned optical devices, in particular electroluminescent devices and photovoltaic devices (i.e. photodetectors or photocells) or in switching devices such as field effect transistors.

When used in OLEDs, polymers according to the invention may be used as solution processable, electron transporting, hole transporting and/or emissive materials in organic light emitting devices.

Examples of repeat units according to the invention include the following:

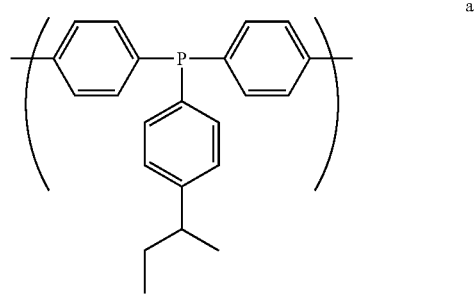

a

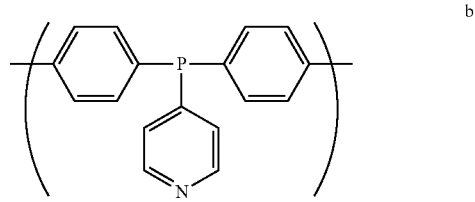

b

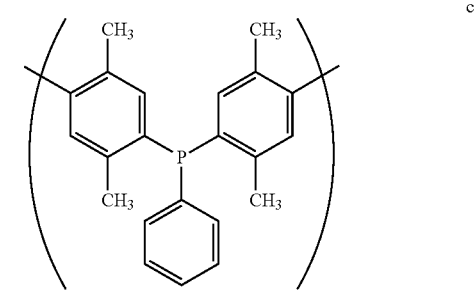

c

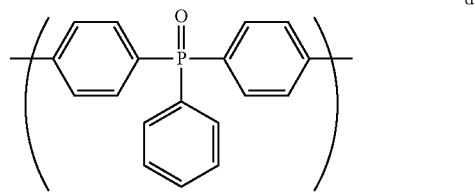

d

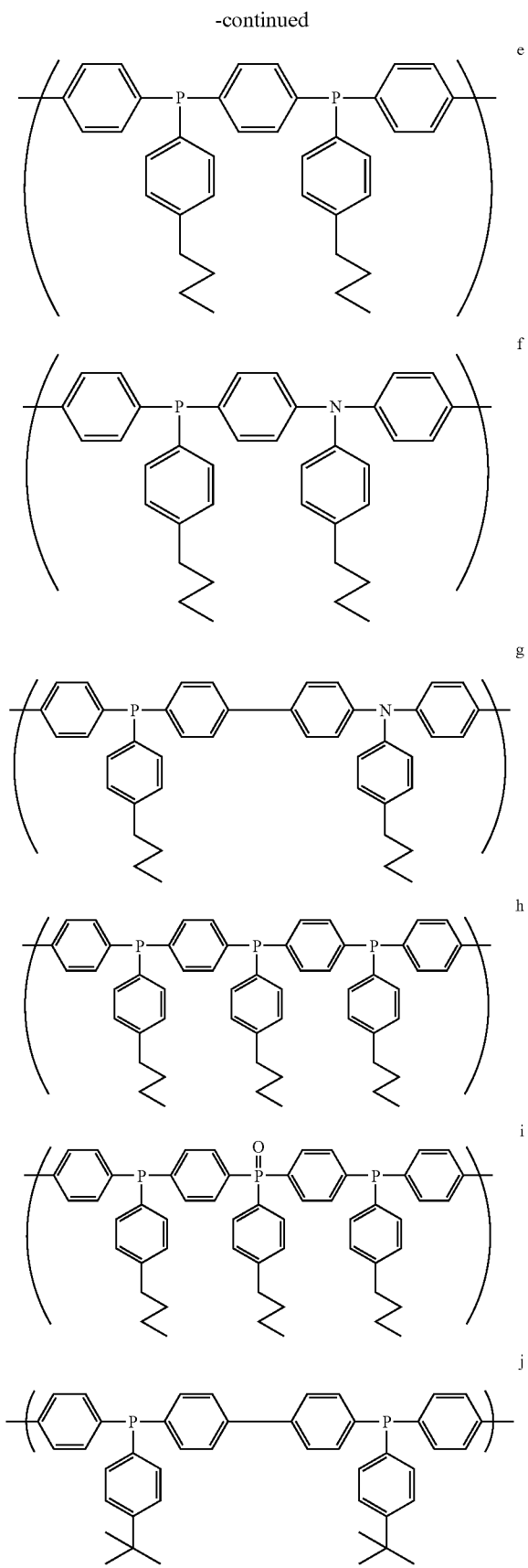

In light of the invention, it will be appreciated that polymers comprising phosphine-containing repeat units are analogous to triarylamine repeat units wherein N-atoms have been replaced by P-atoms, and as such may be used in a manner analogous to prior art triarylamines. In particular, polymers comprising repeat units according to the invention may be used as hole-transporting or blue emissive materials.

The repeat unit may comprise a plurality of P-atoms in place of N-atoms as in repeat units e, g, h, i, j and l above. Alternatively, only one or some of the N-atoms may be replaced by a P-atom or P-atoms as per unit f or k above. The aryl groups of each repeat unit may optionally be substituted (units a, c, and e-j) or unsubstituted (units b, d, k and l). The valency of phosphorus in each repeat unit may be trivalent (units a-c, e-h, j-l), pentavalent (unit d) or a mixture of both (unit i).

The repeat units above represent only some of the possible substituents and substitution patterns for repeat units on the invention. Each of the above repeat units may also be unsubstituted or substituted with one or more substituents X in a manner analogous to that described below for triarylamines.

Examples of substituents X include solubilising groups such as $C_{1-20}$ alkyl, perfluoroalkyl or alkoxy; electron withdrawing groups such as fluorine, nitro or cyano; and substituents for increasing glass transition temperature (Tg) of the polymer such as bulky groups, e.g. tert-butyl or optionally substituted $C_3$ to $C_{30}$ aryl or heteroaryl groups. Also substituents representing a combination of the above, such as $C_6$ to $C_{30}$ alkylaryl or arylalkyl groups, are possible. The polymers may be prepared by Suzuki polymerisation as described in, for example, WO 00/53656 or WO 03/048225 and Yamamoto polymerisation as described in, for example, T. Yamamoto, "Electrically Conducting And Thermally Stable π-Conjugated Polyarylenes Prepared by Organometallic Processes", Progress in Polymer Science 1993, 17, 1153-1205, or WO 04/022626. For example, in the synthesis of a linear polymer by Yamamoto polymerisation, a monomer having two reactive halide groups is used. Similarly, according to the method of Suzuki polymerisation, at least one reactive group is a reactive boron group.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o\text{-}Tol)_3$. The usual ratio of Pd:phosphine ligand lies in the range of 1:1 to 1:10. However, in the present case the phosphine monomer according to formula (III) could also act as a ligand for Pd. In view of this, it is surprising that Suzuki polymerisation for the production of the inventive polymer works very well, even though the Pd:phosphine ratio is much higher due to the presence of the phosphine-based momomers of formula (III). Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate.

Yamamoto polymerisation employs a Ni(0) complex, for example bis(1,5-cyclooctadienyl)nickel(0).

Suzuki polymerisation may be used to prepare regioregular, block and random copolymers from aromatic monomers with two leaving groups LG. A description how polymers with blocky structures can be synthesised is described in detail for example in DE 10337077.3. In particular, homopolymers or random copolymers may be prepared when one leaving group LG is a halogen and the other leaving group LG is a reactive boron group. Alternatively, block or regioregular, in particular AB copolymers may be prepared when both leaving groups of a first monomer are boron and both leaving groups of a second monomer are halide.

The monomer according to the invention may be polymerised alone to form a homopolymer or in the presence of one or more co-monomers to form a co-polymer. Possible co-repeat units derived from such co-monomers are outlined below; it will be appreciated that each of these co-repeat units may be derived from a comonomer comprising two polymerisable groups independently selected from halogen (preferably chlorine, bromine or iodine, more preferably bromine), a boronic acid group, a boronic ester group and a borane group.

As alternatives to halogens as described above, leaving groups of formula $—O—SO_2Z$ can be used wherein Z is as defined above. Particular examples of such leaving groups are tosylate, mesylate and triflate.

Numerous other combinations of leaving groups LG for the two monomers used in Suzuki polymerisation will be apparent to the skilled person. These include:
boronic acids or esters with trialkylsiloxy groups;
boronic acids or esters with diazonium tetrafluoroborates (Tetrahedron Letters, 1997, Vol 38, No 25, pp 4393-4396);
diazonium tetrafluoroborates with metal trifluoroborates (Tetrahedron Letters, 1997, Vol 38, No 25, pp 4393-4396); and
metal trifluoroborates with aryl halides using ligand free palldium (e.g. palladium acetate) (Organic Letters, 2002, Vol 4, No 11, pp 1867-1870).

Where the polymer according to the invention is a co-polymer, it may possess the repeat unit of the invention with one or more different co-repeat units. In a copolymer, the repeat unit of the invention is preferably present in the polymer in 1 to 50 mol %, more preferred in 5 to 30 mol %. One class of co-repeat units is arylene repeat units, in particular: 1,4-phenylene repeat units as disclosed in J. Appl. Phys. 1996, 79, 934; fluorene repeat units as disclosed in EP 0842208, trans-indenofluorene repeat units as disclosed in, for example, Macromolecules 2000, 33(6), 2016-2020; cis-indenofluorene repeat units as described in EP 03014042.0; spirobifluorene repeat units as disclosed in, for example, EP 0707020; dihydrophenanthrene repeat units as disclosed in DE 10337346.2 and stilbene repeat units (commonly known as "OPV" repeat units) as disclosed in WO 03/020790. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer such as bulky groups, e.g. tert-butyl or optionally substituted $C_3$ to $C_{30}$ aryl groups.

A further class of preferred co-repeat units are repeat units comprising one or two amino groups in the repeat unit backbone such as co-repeat units comprising triarylamine groups, in particular repeat units of formulae 1-3:

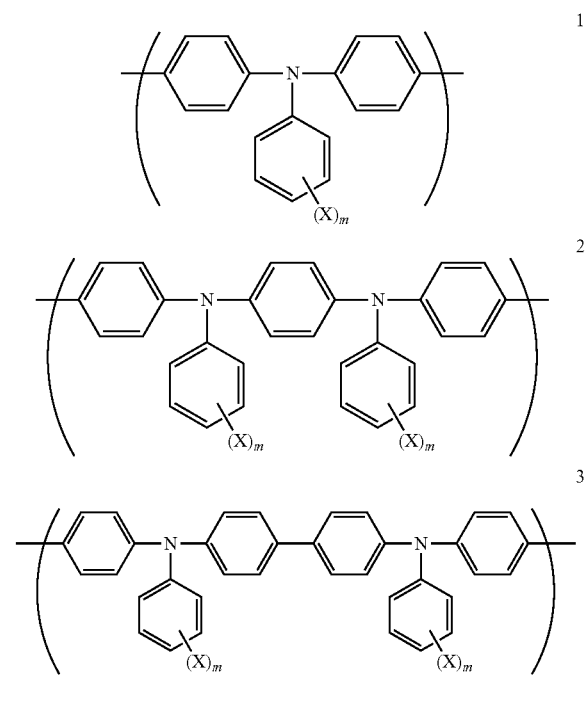

wherein X in each occurrence is independently hydrogen or a substituent and m is 1-3. Preferably at least one X is independently selected from the group consisting of $C_1$ to $C_{20}$ alky, aryl, perfluoroalkyl, thioalkyl, cyano, alkoxy, heteroaryl, alkylaryl and arylalkyl groups. Particularly preferred groups X are $C_1$ to $C_{10}$ n-alkyl (in particular n-butyl), branched $C_1$ to $C_{10}$ alkyl (in particular s-butyl and t-butyl), an $C_1$ to $C_{10}$ n-alkoxy or a trifluoroalkyl (in particular trifluoromethyl) group because they are suitable for helping to select the HOMO level and/or for improving solubility of the polymer. Preferably, m is 1 or 2, more preferably 1. Preferably, where X is a substituent it is located in the meta- or para-position, most preferably in the para-position.

Use of trifluoromethyl groups in repeat units of this type is disclosed in WO 01/66618.

A yet further class of co-repeat units include heteroaryl repeat units such as optionally substituted 2,5-thienyl, pyridyl, diazine, triazine, azole, diazole, triazole, oxazole or oxadiazole; or optionally substituted units of formulae 4-10:

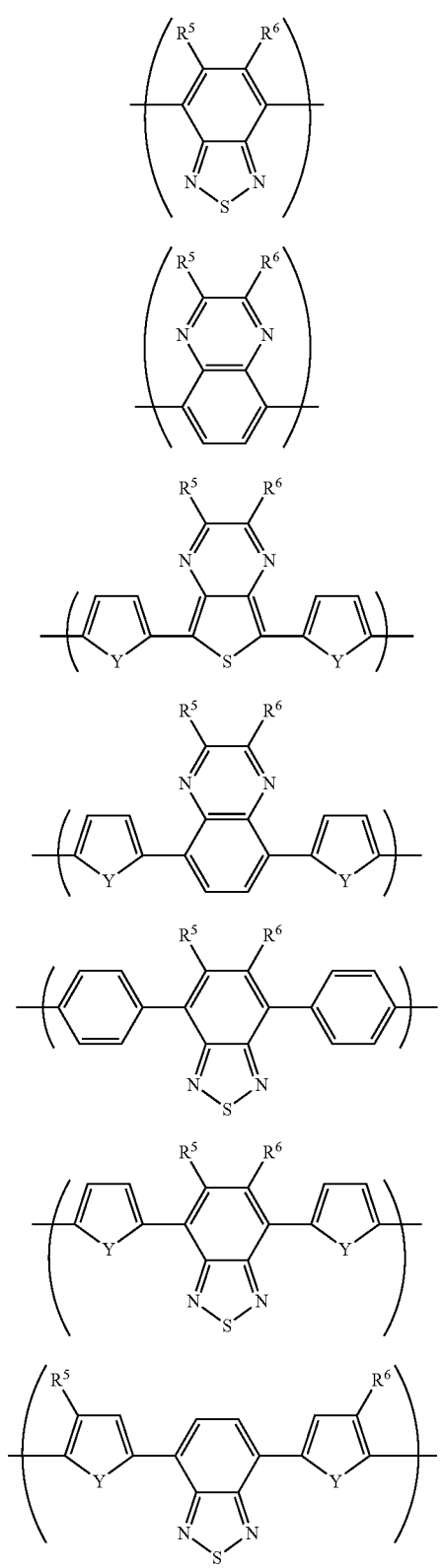

wherein each Y represents sulfur or oxygen, preferably sulfur; and $R^5$ and $R^6$ are the same or different and are each independently hydrogen or a substituent group. Preferably, one or more of $R^5$ or $R^6$ may be selected from hydrogen, $C_1$ to $C_{20}$ alkyl, aryl, perfluoroalkyl, thioalkyl, cyano, alkoxy, heteroaryl, alkylaryl, or arylalkyl. Most preferably, $R^5$ and $R^6$ are independently hydrogen, $C_1$ to $C_{10}$ alkyl or phenyl. Preferably, for practical reasons, $R^5$ and $R^6$ are the same when both are a substituent.

When used in an OLED, polymers according to the invention possess at least one of hole transporting, electron transporting and emissive properties. Where the polymer has more than one of these properties, different properties may be provided by different monomer repeat units or segments of a block co-polymer, in particular segments of the polymer backbone as described in WO 00/55927 or pendant groups as described in WO 02/26859. Alternatively, if the polymer of the invention has only one or two of the properties of hole transport, electron transport and emission, it may be blended with one or more further polymers having the remaining required property or properties as described in WO 99/48160.

Optical devices tend to be sensitive to moisture and oxygen. Accordingly, the substrate of the device preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of a layer of organic hole injection material over the anode is desirable as it assists hole injection from the anode into the layer or layers of semiconducting polymer. Examples of organic hole injection materials include PEDT/PSS as disclosed in EP 0901176 and EP 0947123, or polyaniline as disclosed in U.S. Pat. No. 5,723,873 and U.S. Pat. No. 5,798,170.

The cathode is selected in order that electrons are efficiently injected into the device and as such may comprise a single conductive material such as a layer of aluminium. Alternatively, it may comprise a plurality of metals, for example a bilayer of calcium and aluminium as disclosed in WO 98/10621, or a thin layer of dielectric material such as lithium fluoride to assist electron injection as disclosed in, for example, WO 00/48258.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142.

In a practical optoelectronic device, at least one of the electrodes is semi-transparent in order that light may be absorbed (in the case of a photoresponsive device) or emitted (in the case of a PLED). Where the anode is transparent, it typically comprises indium tin oxide. Examples of transparent cathodes are disclosed in, for example, GB 2348316. Where the polymer of the invention is used in a switching device such as a field effect transistor, it will be appreciated that all of the electrodes may be opaque.

The PLED may be a static image device, i.e. a device that displays only a single image. In the simplest case, the device comprises an anode, cathode and electroluminescent polymer, each of which are unpatterned. Such a device may be suitable for lighting applications or signs displaying a fixed image. Alternatively, the device may be a variable image device, i.e. a device wherein different areas of the electroluminescent layer may be independently addressed. Such a device may be a segmented, passive matrix or active matrix device.

The polymer may be deposited by any one of a range of techniques such as spin-coating, dip-coating, inkjet printing as disclosed in EP 0880303, laser transfer as described in EP 0851714, flexographic printing, screen printing and doctor blade coating. If the technique requires deposition of the polymer from solution, then any one of a range of organic solvents or mixtures of organic solvents may be used including, for example, alkyl-aromatics, in particular mono- or poly-alkylbenzenes such as toluene, xylene and durene.

The present inventors have identified numerous advantages of the polymers according to the invention as compared to prior art amine-containing polymers, as follows:

The polymers according to the invention have a significantly larger HOMO-LUMO bandgap (Eg) than comparative polymer not containing repeating units according to formula (I) (compare Table 1 below). Furthermore, the polymers according to the invention have bluer 1931 PAL CIE co-ordinates for both photoluminescence (PL) and electroluminescence (EL) (compare Table 2 below).

In addition, the present inventors have found that a small red peak is observed in the electroluminescent spectrum of several amine-containing polymers. In contrast, this peak is absent in the electroluminescent spectra of polymers according to the invention.

Other advantages of the phosphines according to the invention over prior art amines are higher external quantum efficiency and current ca. 2.5 times higher for polymers according to the invention.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

EXAMPLES

Monomer 1:
P,P-bis(4-bromo-3,6-dimethylphenyl)phenylphosphine

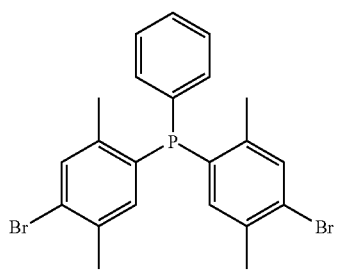

n-Butyllithium (151.5 mmol, 61 ml, 2.5 M solution in hexanes) was added to a solution of 2,5-dibromo-p-xylene (40 g, 151.5 mmol, 1 equiv.) in dry tetrahydrofuran (500 ml) at −78° C. After the addition was finished the reaction was left to stir for 30 minutes. P,P-dichloro-phenylphosphine (10.3 ml, 75.8 mmol, 0.5 equiv.) was then added slowly taking care to keep the temperature below −75° C. A deep red colouration was observed on addition of the phosphine. After the addition was complete the reaction was allowed to warm up to room temperature overnight. The THF was then removed under reduced pressure and the resulting solids taken up in dry toluene. This product/salt mixture was then filtered through a silica plug (toluene eluent, 1 l) and reduced to give a white solid (GC-MS purity approximately 98%). The crude solid was crystallised from either ethylacetate/methanol or hexane to give the above product (30.5 g, yield 85%). GC-MS 99.8%, $M^+$ 476 (expected $M^+$ 476); 31P-NMR (CDCl3) δ (ppm) 198.

Monomer 2:
P,P-bis(4-bromo-3,6-dimethylphenyl)phenylphosphine oxide

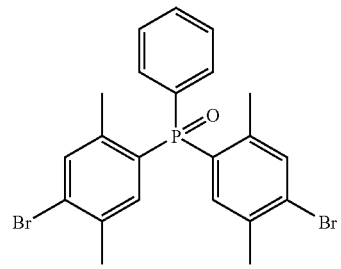

Monomer 1 (30 g, 63.0 mmol, 1 equiv.) was dissolved in methylene choride (200 ml) at room temperature. m-Chloroperoxybenzoic acid (MCPBA, 50 wt %, ca. 22 g, 63.0 mmol, 1 equiv) was then added portion wise. A small exotherm was noted. Once the addition was complete, thin layer chromatography revealed complete conversion after approximately 5 minutes. The crude product was extracted with aqueous sodium hydroxide (2 M) and the organic layer evaporated under reduced pressure to give the crude product as a white solid. Crystallisation from ethanol gave the title compound (19 g, 63%). GC-MS 99.6%, $M^+$ 491 (expected $M^+$ 491)); 31P-NMR (CDCl3) δ (ppm) 34.

Polymer Synthesis

Polymer 1

A copolymer of 6,6,12,12-tetra(n-octyl)trans-indenofluorene-2,8-diyl (T8IF) and the repeat unit derived from Monomer 1 in a ratio of 85% T8IF: 15% phosphine (Polymer 1) was formed by Suzuki polymerisation according to the method set forth in WO 00/53656 using monomer 1 (15 mol %), the ethylene glycol ester of 6,6,12,12-tetra(n-octyl)indenofluorene-2,8-diboronic acid (T8IF-B, 50 mol %) and 2,8-dibromo-6,6,12,12-tetra(n-octyl)indenofluorene (T8-IF-Br, 35 mol %).

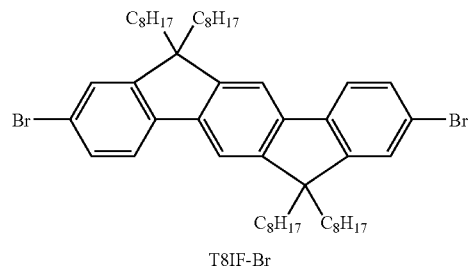

T8IF-Br

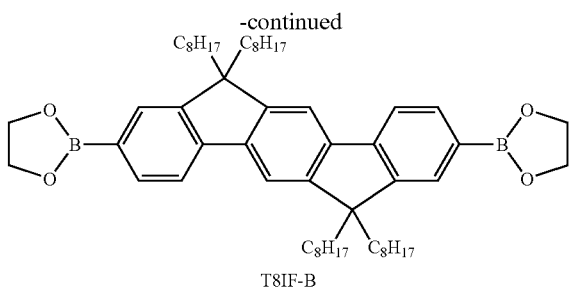

T8IF-B

Polymer 2

Polymer 2 was formed by following the procedure for Polymer 1 above except that Monomer 2 was used in place of Monomer 1.

Device Examples

Electroluminescent devices 1 and 2 were made using polymers 1 and 2 respectively. The devices were formed by providing a glass substrate carrying an anode of indium tin oxide and onto this (a) depositing by spin-coating a layer of poly(ethylene dioxythiophene)/poly(styrene sulfonate) available from H. C. Starck as Baytron P; (b) depositing by spin-coating from xylene solution a layer of polymer according to the invention and (c) depositing by vacuum evaporation a cathode comprising a first layer of calcium and a second, capping layer of aluminium. The device was sealed using an airtight container available from Saes Getters SpA.

The HOMO and LUMO level of the material according to the invention was measured by cyclic voltammetry. For the purpose of comparison, Polymer C1 was made according to the process described above for Polymer P1 except that Monomer C1 (below) was used in place of Monomer 1.

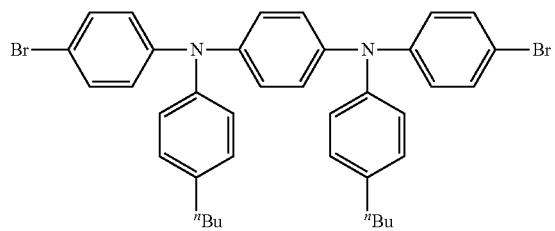

Monomer C1

As can be seen from Table 1 below, the polymers according to the invention have a significantly larger HOMO-LUMO bandgap (Eg) than comparative polymer C1. Furthermore, Table 2 shows that the polymers according to the invention have bluer 1931 PAL CIE co-ordinates for both photoluminescence (PL) and electroluminescence (EL).

In addition, the present inventors have found that a small red peak is observed in the electroluminescent spectrum of amine-containing polymers such as Polymer C1. In contrast, this peak is absent in the electroluminescent spectra of both polymers 1 and 2.

TABLE 1

| Polymer | HOMO | LUMO | Eg |
|---------|------|------|-----|
| 1 | 5.538 | 2.288 | 3.25 (electrical) |
| 2 | 5.587 | 2.299 | 3.288 (electrical) |
| C1 | 4.991 | 2.299 | 2.692 (electrical) |

TABLE 2

| Polymer | EL CIEx, y | PL CIEx, y |
|---------|------------|------------|
| 1 | 0.161, 0.079 | 0.149, 0.173 |
| C1 | 0.165, 0.124 | 0.150, 0.180 |

Other advantages of the phosphines according to the invention over prior art amines, as observed between Polymer 1 and Polymer C1, are higher external quantum efficiency (2.06% vs. 1.34%) and current ca. 2.5 times higher for Polymer 1.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. An oligomer or polymer comprising a first repeat unit and a second repeat unit that is different from the first repeat unit, the first repeat unit having formula (I):

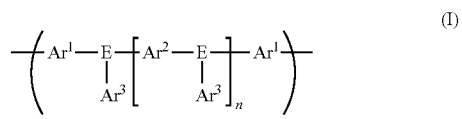

wherein
each E independently represents a nitrogen or a phosphorus atom, with the proviso that at least one E is a phosphorus atom;
each $Ar^1$, $Ar^2$ and $Ar^3$ is the same or different and independently represents an optionally substituted aryl or heteroaryl;
each E is further optionally substituted with at least one additional substituent;
n is an integer from 0 to 3; and
wherein the second repeat unit and optionally further repeat units are selected from optionally substituted phenyl, fluorene, spirobifluorene, indenofluorene, heteroaryl and/or dihydrophenanthrene and
with the further proviso that when E is an unsubstituted atom, then the second repeat unit is directly conjugated to the first repeat unit.

2. An oligomer or polymer according to claim 1 wherein each $Ar^1$, $Ar^2$ and $Ar^3$ is an optionally substituted phenyl.

3. An oligomer or polymer according to claim 1, wherein at least one $Ar^3$ is substituted by a substituent selected from the group consisting of optionally substituted, branched, cyclic or linear $C_{1-20}$ alkyl or $C_{1-20}$ alkoxy; $C_{1-20}$-fluoroalkyl, fluorine, optionally substituted diarylamine and optionally substituted diarylphosphine.

4. An oligomer or polymer according to claim 1, wherein E is selected from the group consisting of nitrogen, unsubstituted phosphorus and phosphorus oxide.

5. An optical device comprising an oligomer or polymer according to claim 1.

6. An optical device according to claim 5, wherein the oligomer or polymer is located in a layer between a first electrode for injection of holes and a second electrode for injection of electrons.

7. An optical device according to claim 6, wherein the device is an electroluminescent device.

8. A switching device comprising an oligomer or polymer according to claim 1.

9. A field effect transistor, comprising:
   an insulator having a first side and a second side;
   a gate electrode located on the first side of the insulator;
   an oligomer or polymer according to claim 1, located on the second side of the insulator; and
   a drain electrode and a source electrode located on the oligomer or polymer.

10. An integrated circuit comprising a field effect transistor according to claim 9.

11. The oligomer or polymer according to claim 1, wherein the second repeat unit and optionally further repeat units are selected from optionally substituted phenyl, fluorene, spirobifluorene, indenofluorene, heteroaryl, or dihydrophenanthrene.

12. The oligomer or polymer according to claim 1, wherein the first repeat unit is present in the polymer in the range from 1 to 50 mol %.

13. A polymer according to claim 1.

* * * * *